United States Patent [19]

Hume, Jr. et al.

[11] 4,398,993

[45] Aug. 16, 1983

[54] NEUTRALIZING CHLORIDE IONS IN VIA HOLES IN MULTILAYER PRINTED CIRCUIT BOARDS

[75] Inventors: David W. Hume, Jr.; John Rasile, both of Endicott, N.Y.

[73] Assignee: International Business Machines Corporation, Armonk, N.Y.

[21] Appl. No.: 392,849

[22] Filed: Jun. 28, 1982

[51] Int. Cl.$^3$ .......................... C23F 1/02; B44C 1/22; C03C 15/00; C03C 25/06
[52] U.S. Cl. ................................ 156/643; 134/22.19; 134/27; 134/34; 156/631; 156/634; 156/644; 156/902
[58] Field of Search ................................ 156/629–634, 156/638, 639, 642, 643, 644, 645, 656, 659.1, 902, 650–652; 134/22.19, 27, 29, 34, 41, 2, 3; 252/79.2; 174/68.5; 29/846, 852; 219/121 LM

[56] References Cited

U.S. PATENT DOCUMENTS 4,155,775  5/1979  Alpaugh et al. .................. 134/3

Primary Examiner—William A. Powell
Attorney, Agent, or Firm—Gerald R. Gugger

[57] ABSTRACT

A neutralization process is provided for neutralizing chloride ions in etched via holes in multilayer printed circuit boards. The process comprises two dip operations of the board in a Neutra-Clean and water solution which is continuously re-circulated. This is followed by subjecting the board to a heated de-ionized cascaded water feed, an ambient overflow de-ionized water rinse, and conveyorized air drying. The Neutra-Clean solution has the ability to penetrate down to the bottom of the via hole and to attract the free chloride ions from the etchant residue. The de-ionized water feed and rinse steps rinse out and remove the Neutra-Clean solution and any residuals formed by chemical reaction.

6 Claims, 9 Drawing Figures

1. STRUCTURE

2. LAMINATE STRUCTURE

3. BLIND VIA PROCESS

4. ETCH PROCESS

5. LASER DRILL

HOLE CLEANING OPERATIONS

SEED

6. PEEL COPPER (SEPARATE 2mil FROM 0.2mil COPPER)

Cl⁻ ION DESTRUCTION OF ZINC INTERFACE LAYER BETWEEN 0.2mil COPPER AND EPOXY 0.2mil CIRCUITIZED PROCESS

4. ETCH PROCESS

↓
NEUTRALIZATION PROCESS
↓

5. LASER DRILL

↓
HOLE CLEANING OPERATIONS
↓
SEED
↓

6. PEEL COPPER (SEPARATE 2mil FROM 0.2mil COPPER)

↓
0.2mil CIRCUITIZED PROCESS

NEUTRALIZING CHLORIDE IONS IN VIA HOLES IN MULTILAYER PRINTED CIRCUIT BOARDS

BACKGROUND OF THE INVENTION

In the making of a multilayer printed circuit board, a number of process steps are involved. First, a basic structure having bonded together a top layer of peel-apart-copper, a chromium layer, and a bottom copper layer having a thin zincate layer on the bottom surface thereof is laminated to an epoxy layer which contains one or more internal copper planes. The laminated structure goes through a blind via process wherein the peel-apart-copper surface is prepared for photoresist and photoresist is applied, exposed and developed to provide a pattern of dots where vias are desired. Next, the developed pattern is etched by a cupric chloride etchant, which contains 1.0 normal HCl acid, to provide blind via holes which extend down to the epoxy layer. After etching, the blind via holes are laser drilled to extend down to one or more of the internal copper planes in the epoxy or they may be made into through holes in the structure. Following the laser drilling, the via holes are cleaned and seeded and the peel-apart-copper and chromium layer is peeled and separated from the bottom copper layer which is then circuitized.

Between the etching operation and the peel-apart operation, there is a considerable lapse of time. During this time interval, it was found that due to cupric chloride residue at the bottom of the via holes which was not completely rinsed out and with time and probably humidity, free chloride ions are generated from the HCl which attack or destroy the thin zincate layer between the copper and the epoxy. The zincate will start to weaken within 12 hours and the time between the etching operation and the peel apart operation generally runs around 4 to 6 weeks. The primary function of the zincate layer is to promote adhesion between the copper and the epoxy. Thus, if the zincate layer is sufficiently weakened or destroyed by the chloride ions, peeling off of the peel-apart-copper and chromium layer will result in the bottom copper layer being torn or separated from the epoxy, particularly in the area surrounding the via holes. This creates an intolerable surface condition for circuitization of the board and results in the board being scrapped.

SUMMARY OF THE INVENTION

The present invention overcomes the aforementioned problem by modifying the process to include neutralization process steps immediately following the etching operation. These process steps comprise two dip operations of the board in a solution of Neutra-Clean, a trade name of the Shipley Co., and water which is continuously re-circulated. This is followed by subjecting the board to a heated de-ionized cascaded water feed, an ambient overflow de-ionized water rinse, and conveyorized air drying. It was found that the Neutra-Clean solution has the ability to penetrate down to the bottom of the via hole and to attract the free chloride ions from the etchant residue. The de-ionized water feed and rinse steps rinse out and remove the Neutra-Clean solution and any residuals formed by chemical reaction.

Accordingly, a primary object of the present invention is to provide a novel and improved process for producing a multilayer printed circuit board.

Another object of the present invention is to provide a novel and improved process for producing a multilayer printed circuit board which includes the neutralization of chloride ions in etched via holes in the board.

A further object of the present invention is to provide a novel and improved process for producing a multilayer printed circuit board which includes the etching of via holes immediately followed by a neutralization process of the etchant residue in the via holes.

A still further object of the present invention is to provide a novel and improved process for producing a multilayer printed circuit board which includes cupric chloride etching of via holes immediately followed by the neutralization of chloride ions in the etchant residue in the via holes by a Neutra-Clean solution.

The foregoing and other objects, features and advantages of the invention will be apparent from the following more particular description of a preferred embodiment of the invention, as illustrated in the accompanying drawings.

DESCRIPTION OF PREFERRED EMBODIMENT

Figure 1:
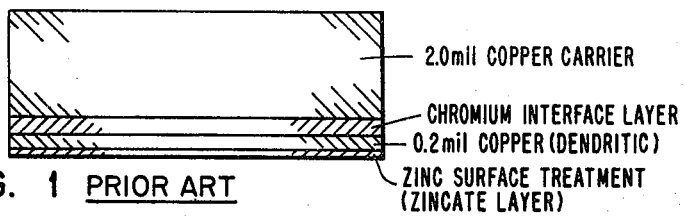
FIGS. 1-6 are schematic views illustrating various stages of a multilayer printed circuit board during a prior art process for producing it.
Figure 2:
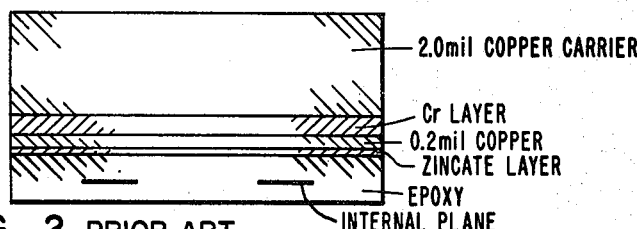

In order to better understand the application of the present invention, a prior art method or process for producing a multilayer printed circuit board will be briefly described. Referring to FIG. 1, there is shown a basic starting structure which comprises a 2.0 mil copper carrier layer bonded to a chromium interface layer having a thickness in the order of 50–100 angstroms. The chromium layer is bonded to a 0.2 mil copper layer having a dendritic surface. The underside of the 0.2 mil copper layer is zinc surface treated to provide a thin zincate layer. The 2.0 mil copper carrier is a peel-apart-copper foil and it is known in the art as "Double Thin", a trade name of the Yates Corporation. It is used to protect the 0.2 mil copper layer from epoxy dust and small depressions during a subsequent lamination process. The chromium interface layer is essential for peeling the copper carrier foil from the 0.2 copper layer. The 0.2 mil copper layer is the base structure of printed circuit lines and has a dendritic surface to enhance mechanical bonding during the lamination process along with a zinc treatment. The zincate layer promotes adhesion between copper and epoxy. This basic structure may be purchased from the Yates Corporation. As shown in FIG. 2, the basic structure is laminated by suitable heat and pressure to epoxy which contains one or more internal copper planes which serve as signal and ground planes.

Figure 3:
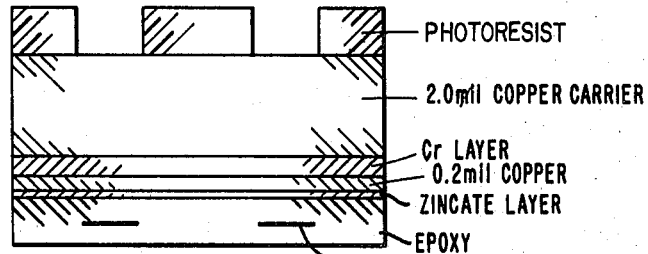
Figure 4:
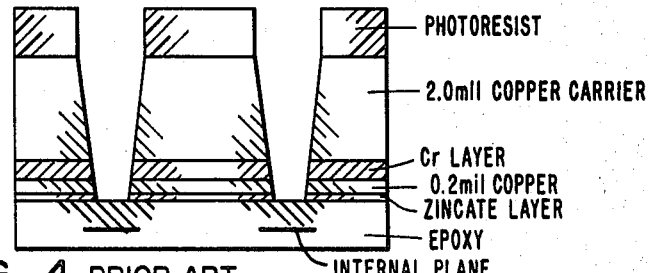

The laminate structure then goes through a blind via process wherein the surface is preped by pumice scrubbing to provide a uniform copper surface for photoresist and in a dip operation, BTA (benzo triazole) is applied to prevent corrosion. Next, the resist Riston, a trade name of E. I. duPont de Nemours Co., is applied at 235° and 15# per square inch. This is folllowed by exposing with UV the hole pattern for the blind hole vias and then developing with methyl chloroform to provide the structure shown in FIG. 3. Next, the developed structure is etched at 130° F. for approximately 3 minutes with a cupric chloride etchant which contains 1.0 normal HCl acid to provide blind via holes down to the epoxy, as shown in FIG. 4.

Figure 5:
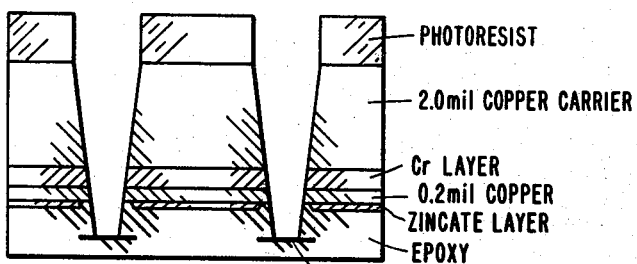

Following the etching operation, the bind via holes are laser drilled down to the internal copper planes in the epoxy, as shown in FIG. 5. It should be noted that by the time the laser drilling operation takes place, a portion of the zincate layer surrounding the via holes has been undercut or destroyed. This is more clearly shown in FIG. 6. The laser drilling operation is followed by hole cleaning operations and seeding. The hole cleaning operations involve vapor blasting with pumice followed by chemical dipping. In seeding, the holes are chemically treated to provide a suitable deposition surface for electroless copper plating.

Figure 6:
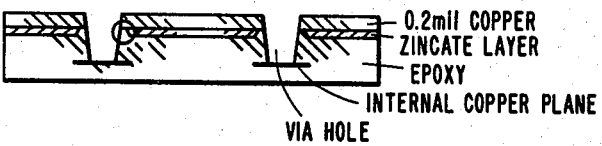

Referring now to FIG. 6, the 2.0 mil peel-apart-copper along with the chromium layer is peeled and separated from the 0.2 mil copper layer. As was previously mentioned, between the etching operation and the peel-apart operation, there is a considerable lapse of time. During this time interval, due to cupric chloride residue at the bottom of the via holes which was not completely rinsed out and with time and probably humidity, free negative chloride ions are generated from the HCl which attack or destroy the thin zincate layer between the 0.2 mil copper and the epoxy. The zincate will start to weaken within 12 hours and the time between the etching operation and the peel-apart operation generally runs around 4 to 6 weeks. The primary function of the zincate layer is to promote adhesion between the copper and the epoxy. Thus, as shown, if the zincate layer is sufficiently weakened or destroyed by the chloride ions, peeling off of the peel-apart-copper and chromium layer will result in the 0.2 mil copper layer being torn or separated from the epoxy, particularly in the areas surrounding the via holes.

Following the peel-apart operation, the 0.2 mil copper goes through the conventional circuitizing process wherein printed circuit lines are formed. However, satisfactory completion of the printed circuitry cannot be accomplished with the surface condition of the 0.2 mil copper shown in FIG. 6.

Figure 7:
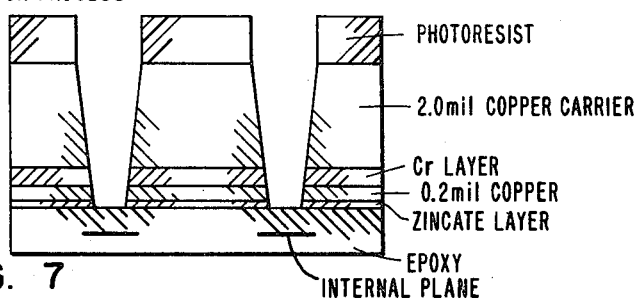
FIGS. 7-9 are schematic views similar to FIGS. 4-6 and including the neutralization process of the present invention.
Figure 8:
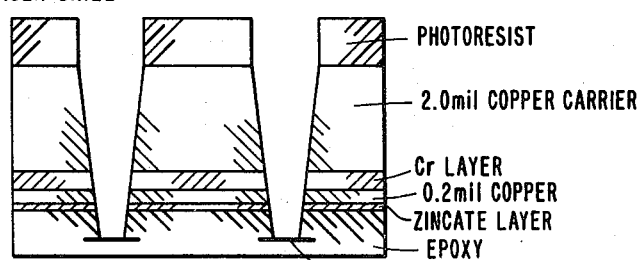
Figure 9:
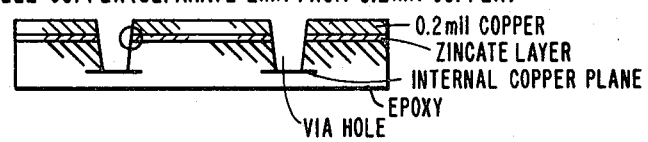

FIGS. 7-9 illustrate the application of the present invention to the prior art process just described. The etch process of FIG. 7 is the same as that described in connection with FIG. 4. The neutralization process of the present invention is carried out immediately following the completion of etching. The process makes use of Neutra Clean which comprises the following constituents:

Alkyl Aryl Sulfonate
Ammonium Sulfite
Ammonium Chloride
Sodium Chloride
Sodium Sulfite The alkyl aryl sulfonate is a wetting agent which allows for uniform wetting of the via hole without allowing the formation of bubbles. Ammonium sulfite and sodium sulfite are cleaning soaps. Ammonium chloride and sodium chloride attract the chloride ions from the cupric chloride etchant.

In the neutralization process, the etched board is subjected to the following operations:
(1) Two 5 minute dips in a Neutra-Clean solution which is continuously re-circulated. The solution comprises 50% of Neutra-Clean and 50% of water at 120° F.
(2) A 2 minute heated de-ionized cascaded water feed at 100° F.
(3) A 2 minute ambient overflow de-ionized water rinse.
(4) Conveyorized air drying to facilitate later inspection.

As was previously mentioned, the dip operations are used to create uniform wetting without the formation of bubbles so that the Neutra-Clean can effectively penetrate down into the via hole and attract the chloride ions. The second dip operation provides a safety factor to insure that bubbles are not formed. The de-ionized water feed and rinse operations rinse out and remove the Neutra-Clean and any residuals due to chemical reaction.

Following completion of the neutralization process, laser drilling, hole cleaning and seeding, separation of the peel-apart-copper and chromium layer, and circuitization are carried out as previously described. However, as shown in FIGS. 8 and 9, due to the neutralization process, there is no undercut etching or destruction of the zincate layer and when the 2.0 mil copper and chromium layer is peeled away, there is no separation or de-lamination of the 0.2 mil copper layer from the epoxy.

While there have been shown and described and pointed out the fundamental features of the invention as applied to the preferred embodiment, it will be understood that various omissions and substitutions and changes may be made in the form and details of the embodiment by those skilled in the art without departing from the spirit of the invention. It is the intention, therefore, to be limited only as indicated by the scope of the following claims.

What is claimed is:

1. The process of drilling blind via holes in a printed circuit board composite which consists of a peel-apart-copper layer covering an epoxy substrate which consists of the steps of:
   etching holes through the peel-apart-copper layer;
   subjecting said holes to a circulating Neutra-Clean solution;
   cleaning said holes to remove said Neutra-Clean solution; and
   utilizing a laser drill to extend said etched holes into the epoxy substrate.

2. The process of drilling blind via holes in a printed circuit board composite which consists of a peel-apart-copper layer covering an epoxy substrate which consists of the steps of:
   etching holes through the peel-apart-copper layer with a cupric chloride etchant containing HCl acid;
   subjecting said holes to a circulating solution of Neutra-Clean and water to neutralize chloride ions in the etchant residue in said holes;
   cleaning said holes with de-ionized water to remove said Neutra-Clean solution and any residuals due to chemical reaction; and
   utilizing a laser drill to extend said etched holes into the epoxy substrate.

3. The process of drilling blind via holes in a printed circuit board composite which consists of a peel-apart-copper layer covering an epoxy substrate which consists of the steps of:
   etching holes through the peel-apart-copper layer with a cupric chloride etchant containing HCl acid;

first and second 5 minute dip operations of said holes in a solution of 50% Neutra-Clean and 50% water at 120° F.;

subjecting said holes to a 2 minute heated de-ionized cascaded water feed at 100° F.

subjecting said holes to a 2 minute ambient overflow de-ionized water rinse; and utilizing a laser drill to extend said etched holes into the epoxy.

4. A process for neutralizing chloride ions in etched via holes in a multilayer printed circuit board, wherein said via holes are etched by a cupric chloride etchant containing HCl acid, said process comprising the steps of:

first and second dip operations of said via holes in a solution of Neutra-Clean and water which is continuously re-circulated;

subjecting said via holes to a heated de-ionized cascaded water feed;

subjecting said via holes to ambient overflow de-ionized water rinse; and air drying the board.

5. A process for neutralizing chloride ions in etched via holes in a multilayer printed circuit board, wherein said via holes are etched by a cupric chloride etchant containing HCl acid, said process comprising the steps of:

first and second dip operations of said via holes in a solution of Neutra-Clean and water which is continuously re-circulated, said solution containing ammonium chloride and sodium chloride which attract free chloride ions from etchant residue in said via holes;

subjecting said via holes to a heated de-ionized cascaded water feed;

subjecting said via holes to an ambient overflow de-ionized water rinse, said water feed and water rinse removing the Neutra-Clean solution and any residuals due to chemical reaction from said via holes; and air drying the board.

6. A process for neutralizing chloride ions in etched via holes in a multilayer printed circuit board, wherein said via holes are etched by a cupric chloride etchant containing HCl acid, said process comprising the steps of:

first and second 5 minute dip operations of said via holes in a solution of 50%
Neutra-Clean and 50% water which is continuously re-circulated at 120° F.;

subjecting said via holes to a 2 minute heated de-ionized cascaded water feed at 100° F.;

subjecting said via holes to a 2 minute ambient overflow de-ionized water rinse; and conveyorized air drying of the board.

* * * * *